United States Patent [19]

Minami et al.

[11] Patent Number: 4,764,659
[45] Date of Patent: Aug. 16, 1988

[54] THERMAL HEAD

[75] Inventors: Keijiro Minami, Hayato; Yasuo Nishiguchi, Kokubu, both of Japan

[73] Assignee: Kyocera Corporation, Kyoto, Japan

[21] Appl. No.: 821,682

[22] Filed: Jan. 23, 1986

[30] Foreign Application Priority Data

Jan. 26, 1985 [JP] Japan .................................. 60-13157
Apr. 23, 1985 [JP] Japan .................................. 60-87998

[51] Int. Cl.⁴ .............................................. H05B 1/00
[52] U.S. Cl. ................... 219/216; 346/76 PH; 400/120; 219/541; 219/542
[58] Field of Search .................. 219/216 PH, 541, 542; 346/76 PH; 361/403, 400, 309, 411; 400/120 PH

[56] References Cited

U.S. PATENT DOCUMENTS 4,595,823 6/1986 Sorimachi et al. ............. 346/76 PH
4,651,164 3/1987 Abe et al. ....................... 346/76 PH

FOREIGN PATENT DOCUMENTS 2650348 5/1978 Fed. Rep. of Germany ...... 361/411
0166474 8/1985 Japan .......................... 216/216 PH

OTHER PUBLICATIONS

IBM Technical Disclosure Bulletin vol. 24, No. 2, 07/1981.

Primary Examiner—E. A. Goldberg
Assistant Examiner—Huan H. Tran
Attorney, Agent, or Firm—Spensley Horn Jubas & Lubitz

[57] ABSTRACT

In an IC-loaded thermal head, a flip chip is used as IC, and respective terminals of IC element are directly connected by wireless bonding to terminals of heat generators of the head and terminals for external connection.

3 Claims, 2 Drawing Sheets

THERMAL HEAD

BACKGROUND OF THE INVENTION

1. Field of the Invention

The present invention relates to a thermal head having heat generators arranged on a substrate and driving integrated circuits (often called "IC" hereinafter) arranged on the substrate to drive the heat generators.

2. Description of the Prior Art

A thermal head is used for the thermal printing method in which color recording is performed on a heat recording paper by Joule heat generated when a pulsating current is applied to heat generators or an ink of a heat-sensitive ribbon is transferred by this Joule heat to a plain paper to effect recording.

Recently, in order to make the structure of the thermal head compact, not only heat generators but also driving IC elements are loaded on one substrate, and thermal heads of this type are now spread.

When a thermal head of this type is assembled, input and output electrodes on driving IC elements should be connected to a wiring pattern comprising heat generator driving lilnes connected to heat generators arranged on a substrate and external connection terminals, IC driving power lines and IC control signal lines. At the present, this connection is performed by wire bonding, and therefore, the following problems arise.

(1) Even if an automatic wire bonding apparatus is used for this wire bonding, respective electrodes of the driving IC elements should be wire-bonded to the wiring pattern one by one in sequence. Since about 0.2 second is necessary for wire-bonding one electrode, when a thermal head for B4 size comprising 32 IC elements, each having 84 input and output electrodes, at a density of 8 dot/mm with a printing width of 256 mm is assembled, about 10 minutes (0.2 second×84 electrodes×32 elements) are necessary for completing the wire bonding operation. Accordingly, mass production is difficult and the cost of the thermal head is increased. Moreover, the automatic wire bonding apparatus is expensive and the equipment cost is greatly increased.

(2) Before the wire bonding operation, driving IC elements should be die-bonded onto the substrate at predetermined positions. Furthermore, in this case, IC elements should be insulated from a wiring pattern on heat generator driving lines and the like formed on the substrate, and therefore, an insulating layer should be formed on the IC element-loaded portion for insulation from the wiring pattern. Accordingly, additional processes are necessary and increase of the cost owing to increase of the number of operation steps cannot be avoided.

(3) Since the bonding wire line is very fine and the diameter is 25 to 35μ, bending or falling is readily caused after the bonding operation, and therefore, a short circuit is formed between input electrodes of the IC element. Consequently, it is impossible to increase the wire bonding density.

(4) Because of characteristics of the wire bonding method, the bonding pad portion of the wiring pattern on the substrate should be arranged outside the IC elements, and a broad bonding area is necessary around the IC chip-loaded portion. Because of this problem as well as the above-mentioned problem (3), it is more difficult to make the structure of the thermal head compact.

SUMMARY OF THE INVENTION

It is therefore a primary object of the present invention to provide a thermal head in which the abovementioned problems involved in the conventional IC-loaded thermal head are solved.

Another object of the present invention is to provide a thermal head in which IC elements are connected by wireless bonding to a wiring pattern arranged on a thermal head substrate closely thereto.

Still another object of the preesnt invention is to provide a thermal head in which the operation of bonding driving IC elements to the thermal head substrate can be accomplished very easily within a short time, formation of a short circuit between electrodes can be prevented, the electrode density can be increased and the structure can be made compact.

In accordance with one fundamental aspect of the present invention, there is provided a thermal head comprising a number of heat generators arranged on a substrate and driving integrated circuit elements loaded on the substrate to drive the heat generators, wherein the substrate has a wiring pattern arranged closely thereto, the wiring pattern comprises a common driving line for connecting the heat generators to a power source for the heat generator, individual driving lines for connecting the heat generators to output terminals of the integrated circuit elements and lines for connecting terminals for connection of the heat generators of the integrated circuit elements to a power source, control terminals and driving power source terminals to corresponding external connection terminals, and the driving integrated circuit elements are flip chips and the respective terminals of the flip chips are connected by wireless bonding to the corresponding lines.

In accordance with one preferred embodiment of the present invention, there is provided a thermal head as set forth above, wherein the substrate has the heat generators on one side and the terminals for external connection on the other side, the flip chips have the output terminals to be cnnected to the individual driving lines concentratedly on one side and the control terminals to be connected to the terminals for external connection and the driving power source terminals on the other side, and the flip chips are arranged so that the outut terminals confront the heat generators and the control terminals and driving power source terminals confront the terminals for external connection.

In accordance with another preferred embodiment of the present invention, there is provided a thermal head as set forth above, wherein the wiring pattern is formed of metallic aluminum and the wiring pattern is covered with nickel at least at parts where wireless bonding of the flip chips is performed.

In the instant specification and appended claims, by the term "flip chip" is meant a very small semiconductor chip in which all the terminals are gathered on one face to form solder mounts or mountainshaped contacts and after the semiconductor surface between the terminals is insulated, the semiconductor is turned over and attached to the substrate. by the term "wireless bonding", it is meant that a wire is not used for connecting the terminals but soldering is effected between the solder mounts or mountain-shaped contacts and the wiring pattern on the substrate within the set area of the abovementioned chip. Furthermore, by the term "wiring pattern on the substrate" is meant a metal film layer formed on the surface of the substrate closely and integrately thereto and patterned by such means as etching.

DETAILED DESCRIPTION OF THE PREFERRED EMBODIMENTS

Figure 1:
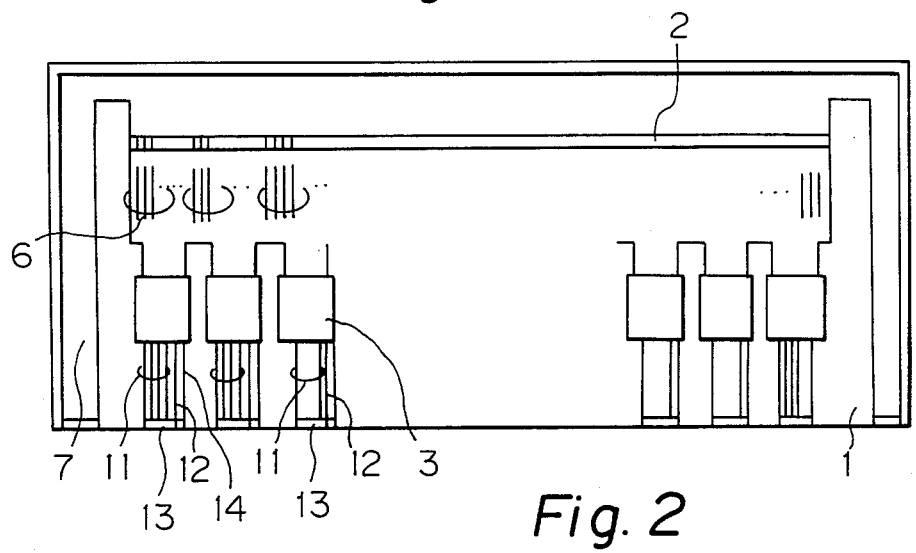
FIG. 1 is a plane view showing the arrangement of the thermal head of the present invention.

Referring to FIG. 1 illustrating an embodiment of the thermal head of the line type according to the present invention, a substrate 1 is composed of an electrically insulating material such as an alumina ceramic material, and a dot-type heat-generating zone 2 and driving IC elements 3 for selectively driving the heat-generating zone 2 and generating heat therein are formed and loaded on the top surface of the substrate 1.

Figure 2:
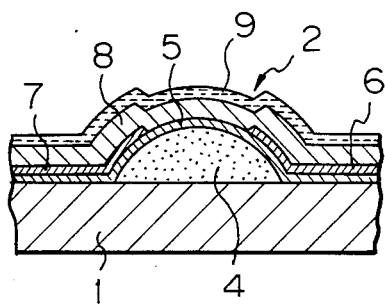
FIG. 2 is a sectional view showing in an enlarged manner the heat generating zone of the thermal head shown in FIG. 1.

As shown in FIG. 2, the heat-generating zone 2 is formed by coating a part of the surface of the insulating substrate 1 with a glass to form a ridged glaze layer 4, and forming a heat generator 5 composed of tantalum nitride ($Ta_2N$) or the like, an individual driving line 6 except the top portion of the heat generator 5 and a common driving line 7 on the top surface of the glaze layer 4 according to the film-forming method. This heat-generating zone 2 exerts the function of performing color recording on a heat-sensitive paper or the like, and when a predetermined electric power is applied to the heat generator 5 through the individual driving line 6 and common driving line 7, the heat generator 5 generates Joule heat so as to elevate the temperature to a level necessary for causing coloration in the heat-sensitive paper or the like, for example, 400° C.

Incidentally, a protecting oxide layer 8 composed of silicon oxide ($SiO_2$) or the like is formed on the heat generator 5 constituting the dot-type heat-generating zone 2 and parts of the surfaces of the individual driving line 6 and common driving line 7 to protect the heat generator from oxidation and corrosion, and an abrasion-resistant layer 9 composed of tantalum oxide ($Ta_2O_5$) or the like is formed on the protecting oxide layer 8 so as to minimize the abrasion by the sliding contact with the heat-sensitive paper or the like. The protecting oxide layer 8 and abrasion-resistant layer 9 are formed on the heat generator 5 by the known sputtering method. The structure of the heat-generating zone 2 is not limited to the above-mentioned structure, but other existing structures may be adopted.

The heat-generating zone 2 ordinarily has 8 to 16 dots per mm arranged in a line on the insulating substrate 1. Driving IC elements 3 for selectively driving the heat-generating zone 2 are loaded in a manner as described below on one side of the heat-generating zone 2 linearly arranged on the insulating substrate 1.

Figure 3:
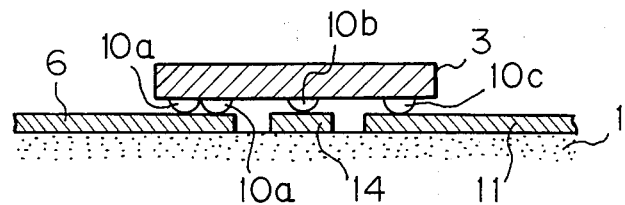
FIG. 3 is a back view showing in an enlarged manner a contact of an IC element.

As shown in FIG. 3, the driving IC element 3 is a flip chip having a plurality of solder bumps 10 on the bottom face thereof. The flip chip is not limited to one having this type of solder bump 10. For example, there may be used a ball type flip chip having a ball of Cu or the like attached to an electrode on the bottom face, a bump type flip chip having a projected electrode (bump) and a pedestal type flip chip having a pedestal formed on a conductor (pad) on the substrate side. However, in view of the bonding operation, a flip chip having a semispherical solder bump is most preferred.

Figure 4:
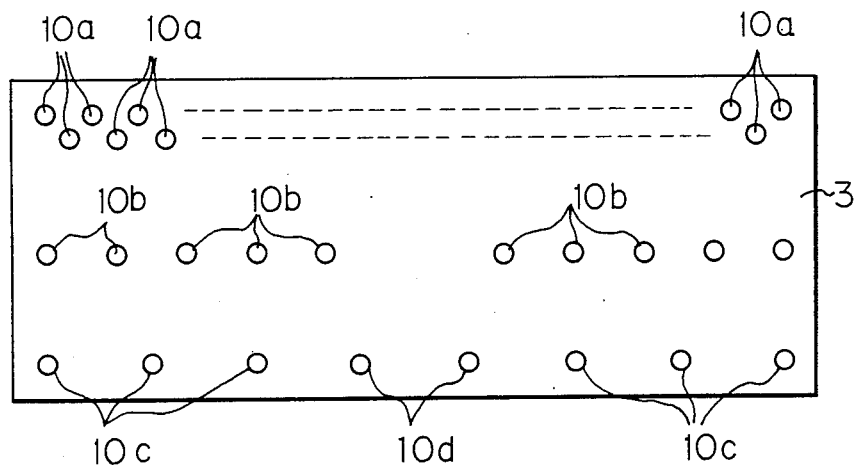
FIG. 4 is a back view showing in an enlarged manner the IC element-loaded portion.

Referring to FIGS. 3 and 4 illustrating a preferred example of the flip chip 3, this flip chip 3 comprises an output electrode 10a for driving the heat generator, an electrode 10b connected to a power source (not shown) for the heat generator, an IC control terminal 10c and a terminal 10d for an IC driving power source. The heat generator driving output electrodes 10a are arranged concentratedly on one side of the flip chip 3 and the control terminal 10c and IC driving power source terminal 10d are arranged on the other side, while the terminal 10b for connection to the power source for the heat generator is arranged in the intermediate portion.

A wiring pattern is formed on the surface of the substrate 1 closely and integrally thereto. This wiring pattern comprises a common driving line 7 for connecting the heat generator 2 to the power source (not shown) for the heat generator, an individual driving line 6 for connecting the heat generator 2 to the output terminal 10a of the IC element 3, an IC control signal line 11 for connecting the control terminal 10c of the IC element 3 to an external connection terminal 13, an IC power source line 12 for connecting the driving power source connection terminal 10d to the external connecting terminal 13 and a heat generator power source line 14 for connecting the heat generator driving power source connection terminal 10b of the IC element 3 to the external connection terminal 13. In FIG. 1, the external connection terminal 13 is shown as a single terminal, but it should be understood that the terminal 13 is independent for the respective lines. In the embodiment illustrated in the drawings, the heat generator 2 is arranged on one side of the substrate 1 and the external connection terminal 13 is arranged on the other side, and the flip chip 3 confronts the heat generator 2 on the side of the output terminal 10a and confronts the external connection terminal 13 on the side of other terminals 10c and 10d. Furthermore, it should be understood that of the respective lines of the wiring pattern, the end portion (pad portion) on the side to be connected to the flip chip 3 is extended to the position where the flip chip 3 is loaded, as shown in FIG. 3.

At the step of bonding the flip chip 3, a reserve solder is left on the wiring pattern 11 formed on the substrate 1, and as shown in FIG. 3, the chip 3 is faced down and registered with the reserve solder to effect temporary bonding and then, bonding is effected by soldering.

If the flip chip is used as the driving IC element 3 and is connected to the wiring pattern on the substrate by wireless bonding in the foregoing manner, the flip chip 3 can be bonded to the wiring pattern at a time irrespectively of the number of electrodes of the flip chip 3, and since a bonding wire line is not necessary, troubles such as bending or falling of the bonding wire line is not caused. Accordingly, the electrode density can be increased. Moreover, since the electrode density can be increased, all the output electrodes 10a of the driving IC element can be formed concentratedly on one side of the slip chip 3. If the output electrodes 10a are formed concentratedly on one side of the flip chip, all the output electrodes 10a can be arranged substantially in parallel to the heat generators 2, and as shown in FIG. 1, all of the individual driving lines 6 for connecting the output electrodes 10a to the heat generators 2 can be made substantially equal in the length.

At the printing operation, by switching of the IC element, an electric current flows in the line 14, contact 10a, line 6, heat generator 2 and line 7 in this order or a reserve order, and heat is generated by the heat generator 2 to effect printing. Since all the individual driving lines 6 are substantially equal in the length as pointed out above, the resistance value is substantially equal in all the individual driving lines 6 and the quantity of supplied electricity is subtantially equal in all the heat generators 6. Accordingly, printing of a high quality can be attained without any density unevenness.

Figure 5:
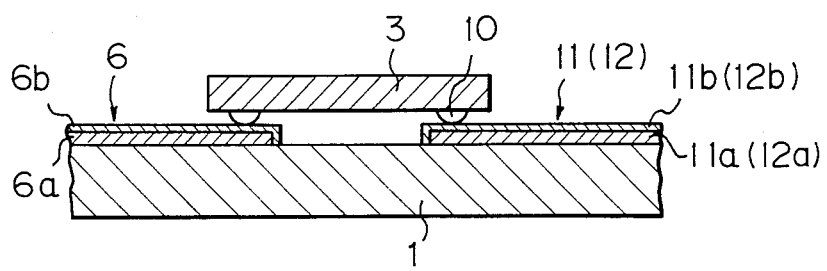
FIG. 5 is an enlarged sectional view showing a preferred example of the wiring pattern used in the present invention.

In the present invention, it is important that a two-layer structure comprising aluminum (Al) and nickel (Ni) should be given to the wiring pattern on the substrate 1 on which flip chips are loaded as the driving IC elements. For this purpose, as shown in FIG. 5, the wiring pattern (individual driving line 6, IC control signal line 11 and IC driving power source line 120 to which the respective electrodes of the flip chip 3 are connected is formed to have a two-layer structure including lower layers 6a, 11a and 12a composed of aluminum (Al) and upper layers 6b, 11b and 12b composed of nickel (Ni). In the wiring pattern having this two-resistance and a good compatibility with alumina (Al$_2$O$_3$) and is hardly absorbed in a molten solder. Accordingly, a wiring pattern having a high bonding strength to the insulating substrate 1 and a small power loss can be formed on the insulating substrate 1. Furthermore, since nickel (Ni) has a good wettability with a solder and is hardly absorbed in a molten solder, the flip chip 3 can be tightly soldered to the wiring pattern.

It is generally preferred that the thickness of the lower Al layer be 0.5 to 2 microns and the upper Ni layer be 1 to 4 microns.

In the embodiments shown in FIGS. 3 and 5, a conductor pattern is directly formed on the subtrate 1, but there may be adopted a modification in which a heat-generating resistor layer 5 is formed on the substrate 1 and a conductor layer is formed thereon, as in the portion of the heat generating zone shown in FIG. 2.

The following effects can be attained when the thermal head of the present invention having the abovementioned structure is used.

(1) Since all the electrodes of driving IC elements can be bonded at a time to a wiring pattern on the substrate, the time required for the bonding operation can be shortened and a good mass productivity can be attained. Moreover, since a solder reflow apparatus can be used for the bonding operation, the equipment can be greatly simplified over the conventional wireless bonding equipment.

(2) Since an insulating layer need not be formed for loading driving IC elements on the substrate, the number of the operation steps is decreased and the manufacturing cost can be greatly reduced.

(3) Since a bonding wire need not be used, troubles caused by bending or falling of the bonding wire, such as formation of a short circuit between electrodes, are not caused at all. Furthermore, the bonding force attained by wireless bonding is very high and in the order to 100 g per bump, while the bonding force attained by wire bonding is in the order of 10 g per bump. Accordingly, the reliability of the bonding is very high.

(4) Since a bonding wire is not necessary, the electrode density in driving IC elements can be increased, and as described hereinbefore, all the individual driving lines for the heat generators can be made equal in the length and the density unevenness, which is due to deviations of the resistance value in the wiring, can be obviated.

(5) In case of wireless bonding, a broad bonding area as required in case of wire bonding is not necessary and the density of heat generator driving lines and other lines in the wiring pattern can be increased in accordance with increase of the electrode density in driving IC elements. The size of the thermal head can be reduced and the structure can be made compact.

(6) When driving IC elements are wirelessly bonded to the wiring pattern through a solder according to the present invention, since the lower Al layer of the wiring pattern has a good bondability to the substrate and the upper Ni layer of the wiring pattern is hardly absorbed in a molten solder, driving IC elements can be tightly bonded to the wire pattern.

Consequently, the practical value of the thermal head of the present invention is very high.

We claim:

1. A thermal head comprising:
   a substrate;
   a number of heat generators arranged on one side of the substrate;
   terminals for external connection on the other side of the substrate, said terminals including a driving power source terminal and control terminals;
   flip chips, each of which comprises a driving integrated circuit element;
   positions for loading the flip chips arranged in the intermediate portion of the substrate;
   a common driving line for connecting the head generators to a driving power source terminal of the external connection terminals;
   output terminal pads, control terminal pads and driving power source terminal pads located in the flip chip-loading positions;
   individual driving lines for connecting the heat generators to the output terminal pads; and
   lines for connecting the control terminal pads and the driving power source terminal pads to corresponding external connection terminals, respectively;
   wherein each of the flip chips has solder electrode bumps as terminals on the bottom face thereof;
   each of the pads is formed of metallic aluminum and has a nickel covering;
   the solder electrode bumps of each of the flip chips includes output electrode bumps on one side of the chip, control electrode bumps on the other side thereof and power source electrode bumps in the intermediate portion thereof;
   each of the flip chips and each of the flip chip-loading positions are arranged so that the output electrode bumps, the control electrode bumps and the power source electrode bumps correspond to the output terminal pads, the control terminal pads and the driving power source pads, respectively, and that the output electrode bumps and the output terminal pads confront the heat generators; and
   each of the bumps and the corresponding pads are bonded by soldering.

2. A thermal head, comprising:
   a substrate;
   a plurality of heat generating elements linearly arranged on the substrate;

a plurality of external connection terminals on the substrate;

a plurality of nickel-plated aluminum output pads for heat generating element driving currents and nickel-plated aluminum control pads for integrated circuit control signals wherein each output pad is electrically connected to a heat generating element and each control pad is electrically connected to an external connection terminal;

a nickel-plated aluminum driving current source pad electrically connected to an external connection terminal and positioned intermediate the outut pads and the control pads; and a plurality of integrated circuits flip-bonded to the pads, each circuit for current driving a plurality of heat generating elements and having a plurality of output electrode solder bumps on one side of the chip, a plurality of control electrode solder bumps on the other side of the chip and a plurality of driving current source solder bumps positioned intermediate of and substantially co-extensive to the output bumps and control bumps;

wherein the output, control and driving current source bumps of each chip are arranged to register for solder bonding with the associated output, control and driving current source pads of the substrate.

3. A thermal head as set forth in claim 1, wherein the wiring pattern is formed of metallic aluminum and the wiring pattern is covered with nickel at least at parts where wireless bonding of the flip chips is performed.

* * * * *